United States Patent
Maeda et al.

(10) Patent No.: US 8,829,813 B2
(45) Date of Patent: Sep. 9, 2014

(54) CORRECTION CIRCUIT, DRIVE CIRCUIT, LIGHT-EMITTING DEVICE AND CORRECTION METHOD OF CURRENT PULSE WAVEFORM

(75) Inventors: Osamu Maeda, Kanagawa (JP); Takeshi Yuwaki, Kagoshima (JP); Katsuhisa Daio, Kagoshima (JP); Koichi Kobe, Kanagawa (JP); Hirofumi Nakano, Kanagawa (JP); Takahiro Arakida, Kanagawa (JP)

(73) Assignee: Sony Corporation, Tokyo (JP)

( * ) Notice: Subject to any disclaimer, the term of this patent is extended or adjusted under 35 U.S.C. 154(b) by 734 days.

(21) Appl. No.: 12/929,677

(22) Filed: Feb. 8, 2011

(65) Prior Publication Data
US 2011/0241571 A1  Oct. 6, 2011

(30) Foreign Application Priority Data

Mar. 31, 2010 (JP) ................. 2010-083267

(51) Int. Cl.
*G05F 1/00* (2006.01)
*H05B 37/02* (2006.01)
*H01S 5/042* (2006.01)
*H01S 5/06* (2006.01)
*H01S 5/183* (2006.01)

(52) U.S. Cl.
CPC ............. *H01S 5/042* (2013.01); *H01S 5/0612* (2013.01); *H01S 5/183* (2013.01)
USPC ........................................ 315/307; 315/291

(58) Field of Classification Search
USPC ............. 372/38.1, 38.01, 38.02, 38.03, 38.4, 372/38.07, 38.08, 38.09; 315/224, 291, 315/307, 308
See application file for complete search history.

(56) References Cited

U.S. PATENT DOCUMENTS

| 4,888,777 | A | * | 12/1989 | Takeyama | ................ | 372/29.01 |
| 5,065,401 | A | * | 11/1991 | Scifres et al. | ............... | 372/29.02 |
| 5,325,225 | A | * | 6/1994 | Suzaki et al. | ................ | 398/195 |
| 8,619,827 | B2 | * | 12/2013 | Maeda et al. | ............... | 372/38.07 |
| 2002/0181520 | A1 | * | 12/2002 | Iguchi et al. | ............... | 372/38.02 |

FOREIGN PATENT DOCUMENTS

JP  2008-306118 A  12/2008

* cited by examiner

*Primary Examiner* — Minh D A
(74) *Attorney, Agent, or Firm* — Rader, Fishman & Grauer PLLC

(57) ABSTRACT

A drive circuit and a drive current correcting method are described herein. The drive circuit comprises a current source that outputs a drive current, and a correction circuit that outputs a correction current. The correction circuit includes a first RC time constant circuit. An output terminal of the current source is connected to an output terminal of the correction circuit.

27 Claims, 11 Drawing Sheets

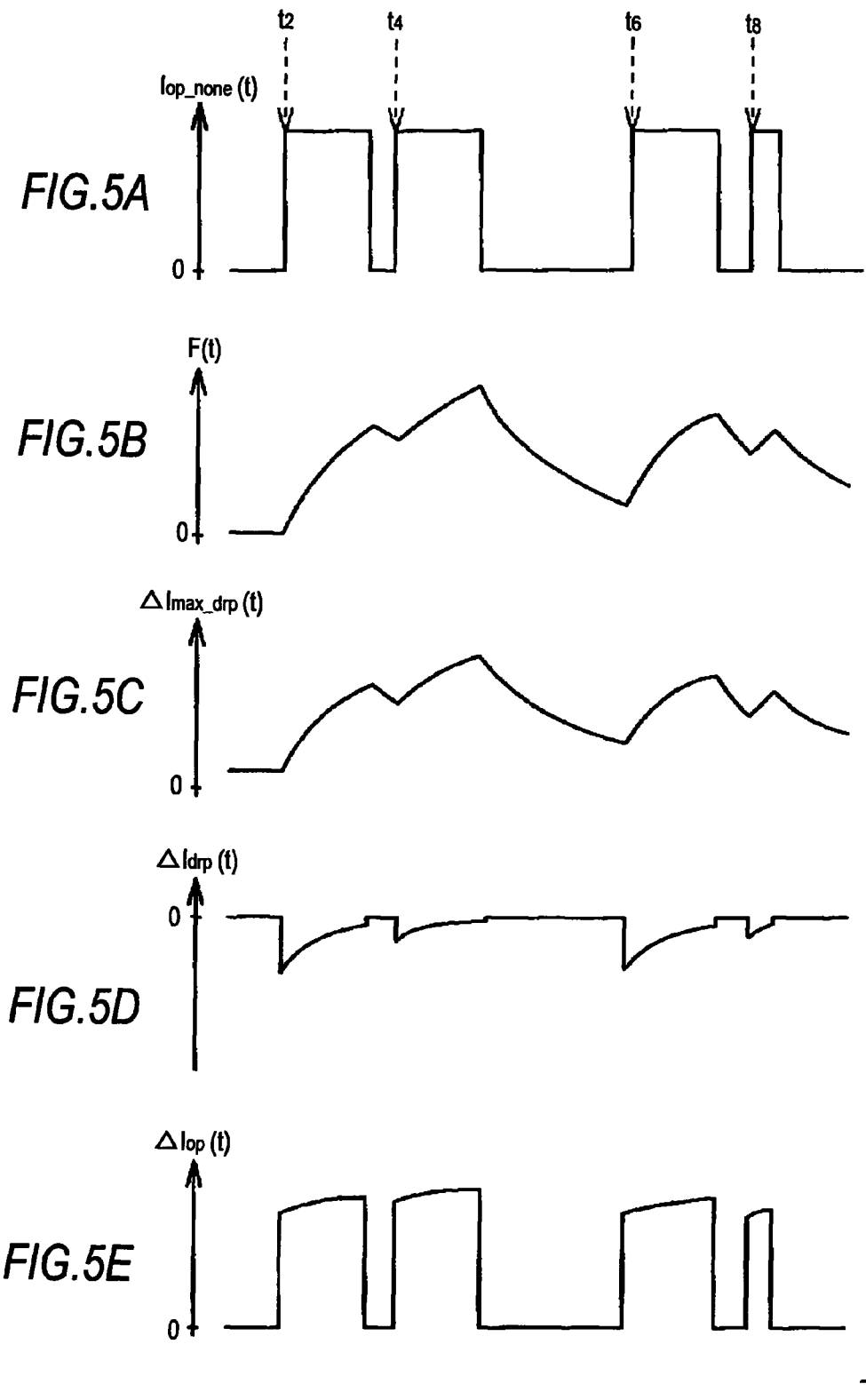

FIG.8
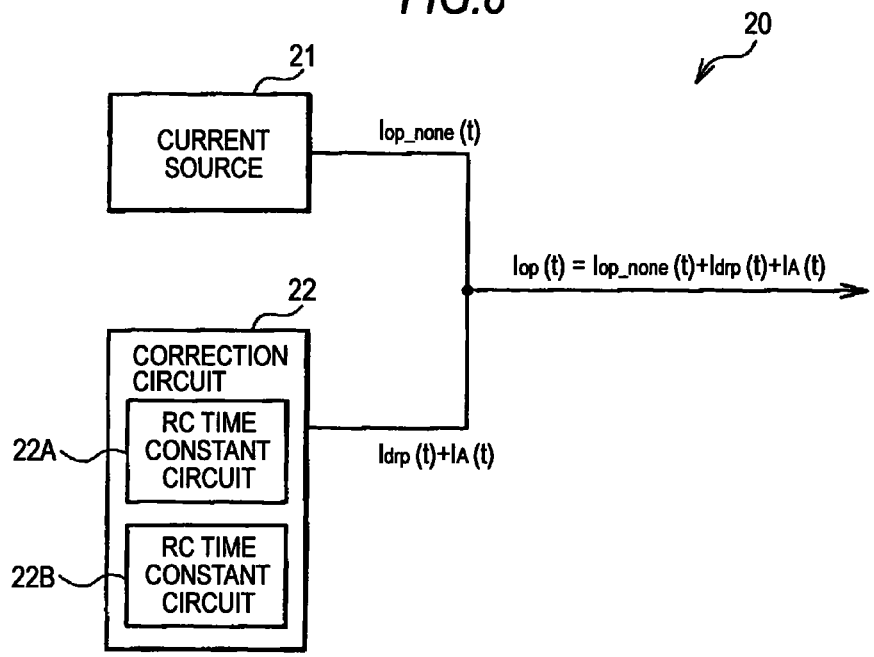
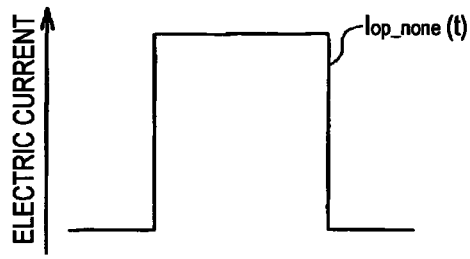
FIG.9A
FIG.9B
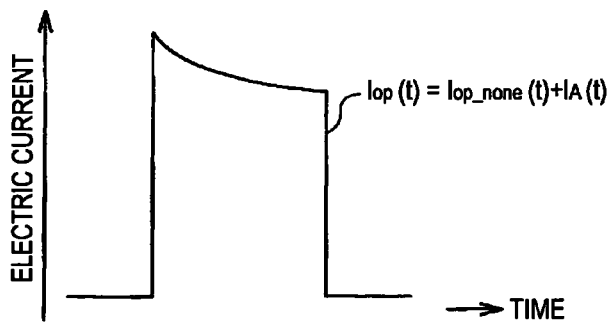
FIG.9C

CORRECTION CIRCUIT, DRIVE CIRCUIT, LIGHT-EMITTING DEVICE AND CORRECTION METHOD OF CURRENT PULSE WAVEFORM

BACKGROUND OF THE INVENTION

1. Field of the Invention

The present invention relates to a correction circuit correcting a current pulse waveform to be applied to a surface-emitting semiconductor laser which emits laser light from an upper surface as well as a drive circuit and a light emitting drive including the correction circuit. The invention also relates to a correction method of the current pulse waveform applied to the semiconductor laser.

2. Description of the Related Art

The surface-emitting semiconductor laser is different from a Fabry-Perot resonator semiconductor laser in related art, which emits light in a direction orthogonal to a substrate and in which many resonator structures can be arranged on the same substrate in a two-dimensional array state. Accordingly, the surface-emitting semiconductor laser attracts attention in technical fields of data communication, printers and the like.

The surface-emitting semiconductor laser generally includes a Mesa-shaped resonator structure in which a lower DBR layer, a lower spacer layer, an active layer, an upper spacer layer, a current confinement layer, an upper DBR layer and a contact layer are stacked in this order. In such semiconductor laser, an oscillation wavelength is determined by an effective resonator length of the resonator structure, and the magnitude of light output will be largest in a emission wavelength corresponding to a bandgap of the active layer. Accordingly, the resonator structure and the active layer are normally configured so that the effective resonator length of the resonator structure and the emission wavelength of the active layer are equal to each other (refer to JP-2008-306118 (Patent Document 1)).

SUMMARY OF THE INVENTION

A drive circuit and a drive current correcting method are described herein.

By way of example, the drive circuit comprises a current source that outputs a drive current, and a correction circuit that outputs a correction current. The correction circuit includes a first RC time constant circuit. An output terminal of the current source is connected to an output terminal of the correction circuit.

BRIEF DESCRIPTION OF THE DRAWINGS

FIGS. 5A to 5E are waveform diagrams for explaining composition of an output waveform of a current source of FIG. 2 and an output waveform of a correction circuit of FIG. 2;

FIG. 8 is a diagram showing another example of the internal configuration of the laser drive circuit of FIG. 1;

FIGS. 9A to 9C are graphs indicating examples of current pulse waveforms generated by the laser drive circuit of FIG. 8;

DETAILED DESCRIPTION OF THE PREFERRED EMBODIMENTS

Generally, a cavity length is extremely small, which is approximately $1\lambda$ to $2\lambda$ ($\lambda$ is an oscillation wavelength) in the surface-emitting semiconductor laser, therefore, the oscillation wavelength is fixed by the cavity length. Accordingly, the surface-emitting semiconductor laser can oscillate at a wavelength different from the emission wavelength (wavelength of the maximum gain) of the active layer. Therefore, a device temperature at which a threshold current will be minimum can be arbitrarily selected depending on the design of a wavelength detuning $\Delta\lambda$. However, most practically, the device temperature at which the threshold current will be minimum is a value in a range from 0° C. to 60° C.

When sufficient light output is desired to be obtained on the high-temperature side, it is necessary to design the wavelength detuning $\Delta\lambda$ to be high. For example, in a surface-emitting semiconductor laser in a band from 660 nm to 680 nm, in which an active layer 53 includes a red-color material (GaInP or AlGaInP), the threshold current becomes minimum when the wavelength detuning $\Delta\lambda$ is 19 nm at a device temperature $T_0$ of approximately 50° C. Incidentally, the fact that the threshold current has temperature dependence means that light output under fixed current also has temperature dependence.

Figure 6:
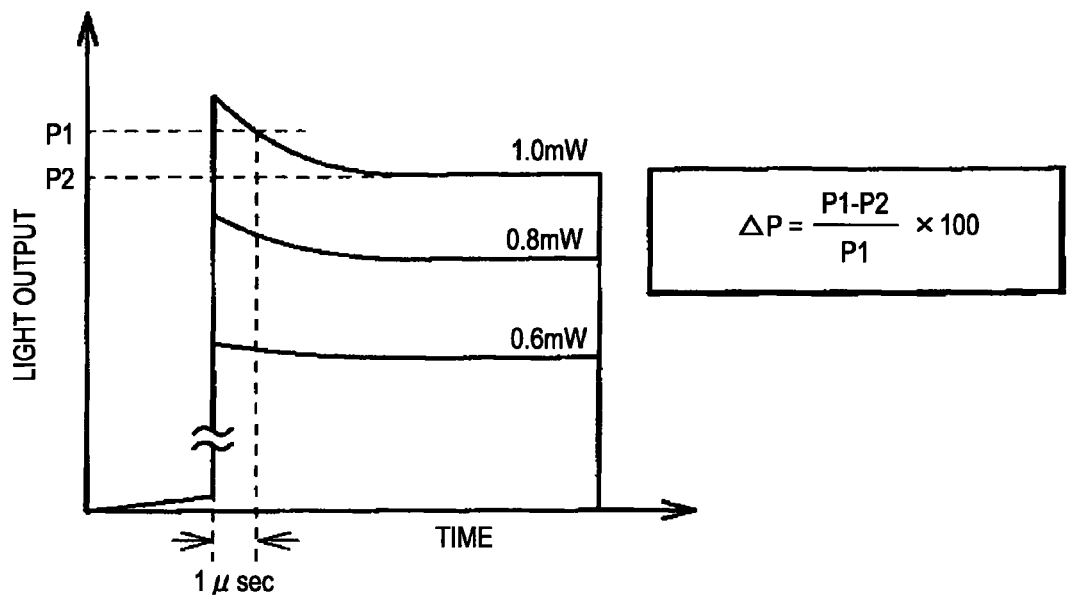
FIG. 6 is a graph showing an example of apply power dependence of droop.

For example, in the surface-emitting semiconductor laser having an oscillation wavelength of 680 nm, when the ambient temperature is increased by 10° C. under the drive state of 50° C. and 1 mW, light output is reduced by approximately 20° C. Even when the surface-emitting semiconductor laser is pulse-operated, the device temperature is gradually increased at the same time as the current pulse is applied to the device, and light output is gradually reduced along with the temperature increase. This is a phenomenon called "droop", which is well known in the semiconductor laser. The phenomenon prominently appears when applied power is high, and for example, it is found that the reduced amount of light output is increased as the applied power is changed from 0.6 mW to 1 mW as shown in FIG. 6. When the droop is evaluated in a quantitative manner, for example, the following equation is used.

$$\Delta P = (P1-P2)/P1 \times 100 (\%)$$

In the above equation, $\Delta P$ represents the droop (light-output reduction) amount. P1 represents light output obtained when 1 μsec has passed from the rising and P2 represents light output obtained when light output is in a normal state.

As a method of correcting the droop, for example, a method described in JP-A-2002-254697 (Patent Document 2) exists. There is a description in a paragraph [0038] of Patent Document 2, in which "as the heat generation amount highly tends to depend on electric current flowing thereto rather than existence of laser light emission, the light amount is reduced with a similar envelope curve even when light emitting sections are intermittent in the case that bias current flows continuously". In the invention described in Patent Document 2, correction based on the thought is made.

Figure 7:
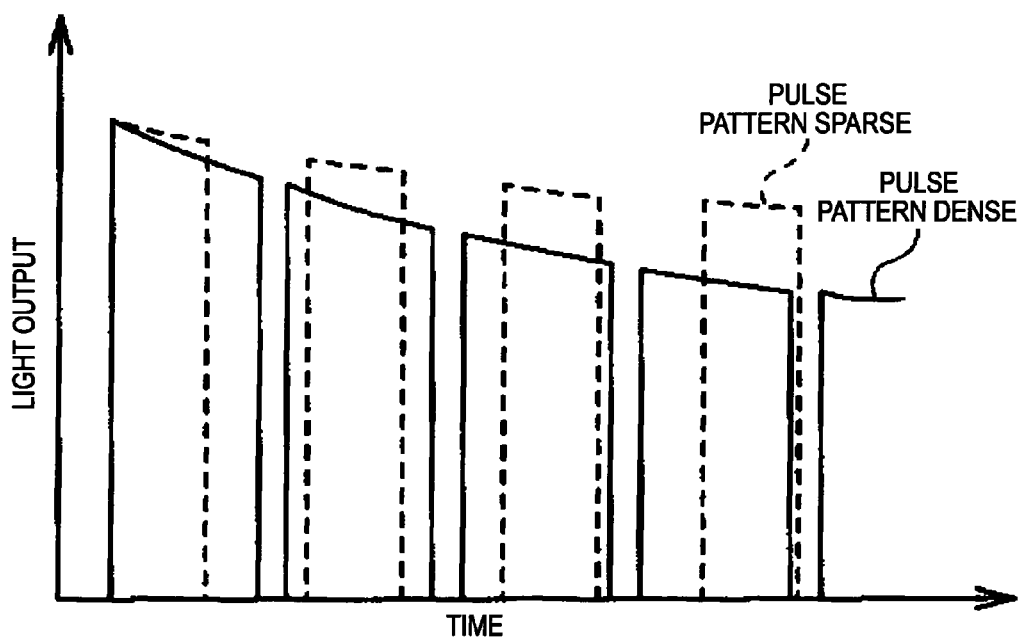
FIG. 7 is a graph showing an example of the relation between pulse pattern density and a droop curve.

In a drive condition in which a threshold is high as well as switching current is low, the above assertion seems to be correct. However, various pulse patterns are expected in the actual driving, therefore, it should be considered that "the heat generation amount depends on the light emitting patterns". Particularly, in a low-threshold laser such as the surface-emitting semiconductor laser, a drive state in which the switching current exceeds the bias current is not exceptional. Particularly, as the switching current becomes higher in the case of driving under high-temperature environment, variation of a droop curve (light output reduction curve) according to the light emitting patterns becomes more prominent. For example, as shown in FIG. 7, as the pulse pattern becomes dense, the droop curve is decreasing to the right.

As described above, it was not easy to correct the droop accurately in related-art methods, when the droop curve varies according to the difference of drive conditions such as light-emitting patterns, current values and temperatures.

In view of the above, it is desirable to provide a correction circuit capable of correcting droop in accordance with the difference of drive conditions, as well as a drive circuit and a light emitting device having the correction circuit. It is further desirable to provide a method of correcting a current pulse waveform capable of correcting droop in accordance with the difference of drive conditions.

In the correction circuit, the drive circuit, the light-emitting device and the correction method of the current pulse waveform according to the embodiments of the invention, the phenomenon called droop in which light output is reduced with temperature increase can be reduced by using the first RC time constant circuit, therefore, the droop correction in accordance of the difference of drive conditions can be performed.

In the correction circuit, the drive circuit, the light-emitting device and the correction method of the current pulse waveform according to the embodiments of the invention, the current pulse waveform outputted from the current source can be corrected so that the pulse waveform of light output of the semiconductor laser comes close to the rectangular shape by using the first RC time constant circuit and the second RC time constant circuit including plural third time constant circuit which attenuate the pulse-height value of the current pulse with time, as a result, not only the waveform rounding due to the droop but also the waveform rounding of light output due to the wavelength detuning $\Delta\lambda$ can be reduced. Hereinafter, an embodiment of the invention will be explained with reference to the drawings.

Figure 1:
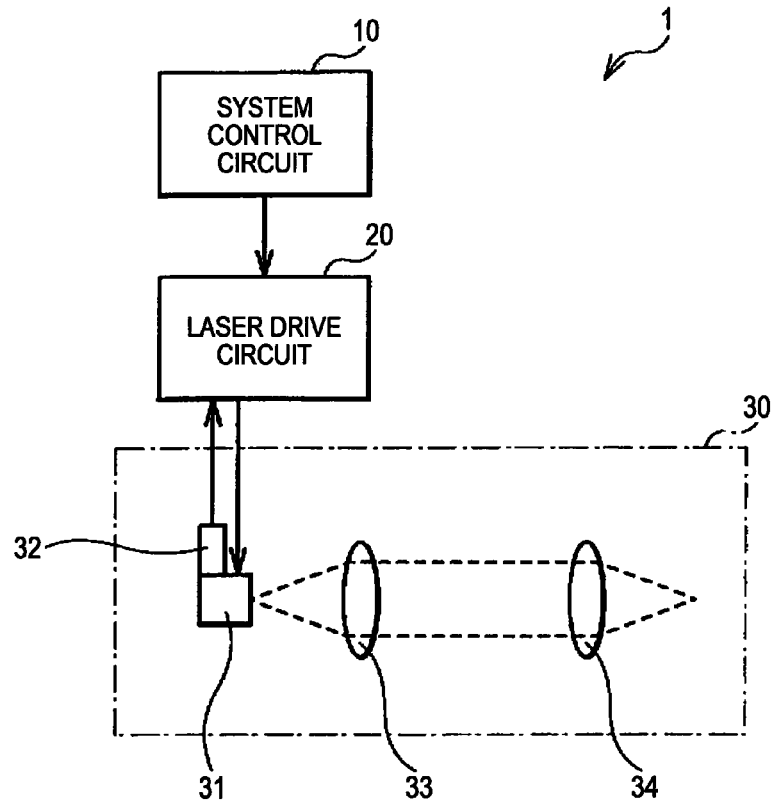
FIG. 1 is a diagram showing an example of a schematic configuration of light-emitting device according to an embodiment of the invention.

FIG. 1 shows an example of a schematic configuration of light-emitting device 1 according to an embodiment of the invention. The light-emitting device 1 includes, for example, a system control circuit 10, a laser drive circuit 20 and an optical system 30 as shown in FIG. 1.

The system control circuit 10 controls driving of a semiconductor laser device 31 through the laser drive circuit 20.

The optical system 30 includes, for example, a thermistor 32, a collimator lens 33 and an objective lens 34. The semiconductor laser device 31 is configured by including one or plural surface-emitting semiconductor lasers (not shown). A surface-emitting semiconductor laser included in the semiconductor laser device 31 (referred to simply as a semiconductor laser) is configured by including, for example, a laser structure unit provided on a substrate though not shown. The laser structure unit has a vertical cavity structure in which the active layer is sandwiched by a pair of multi-layer reflective mirrors (not shown), emitting laser light from an upper surface. The active layer includes, for example, a red color material (GaInP or AlGaInP). At this time, a wavelength detuning $\Delta\lambda$, which is the difference between an emission wavelength of the active layer and an oscillation wavelength of the surface-emitting semiconductor laser, is 15 nm or more. The active layer may include other materials, for example, an infrared material (for example, GaAs or AlGaAs). In this case, the wavelength detuning $\Delta\lambda$ is 13 nm or more.

The thermistor 32 detects (measures) temperature in the vicinity of the substrate of the semiconductor laser (or ambient temperature of the semiconductor laser). A resistance value of the thermistor 32 varies in accordance with the temperature in the vicinity of the substrate (or ambient temperature of the semiconductor laser). Accordingly, the temperature in the vicinity of the substrate (or ambient temperature of the semiconductor laser) can be detected by reading the resistance value of the thermistor 32. The collimator lens 33 is an optical device shaping laser light emitted from the semiconductor laser device 31 into parallel light. The objective lens 34 is an optical device collecting laser light made to be parallel light by the collimator lens 33 as well as irradiating the light toward a not-shown object to be irradiated.

Figure 2:
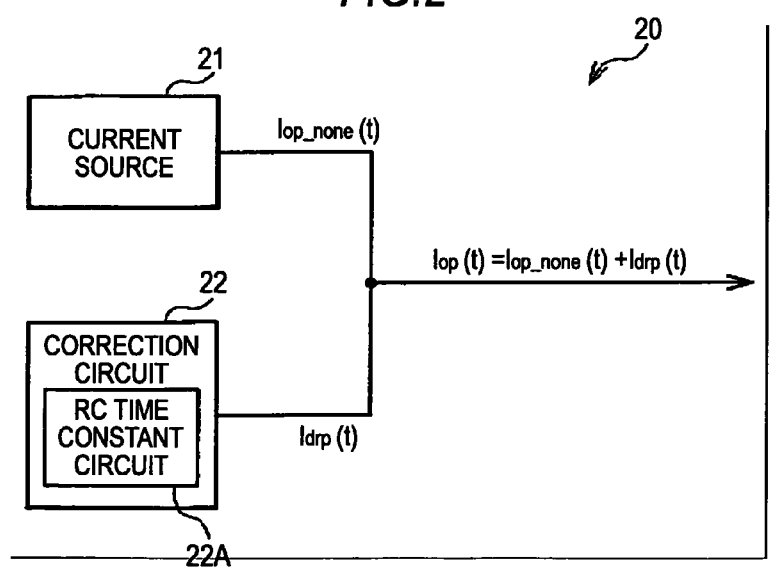
FIG. 2 is a diagram showing an example of an internal configuration of a laser drive circuit of FIG. 1.

The laser drive circuit 20 applies electric current to the semiconductor laser to allow the semiconductor laser to emit light. The laser drive circuit 20 includes, for example, a current source 21 and a correction circuit 22 as shown in FIG. 2.

Figure 3A:
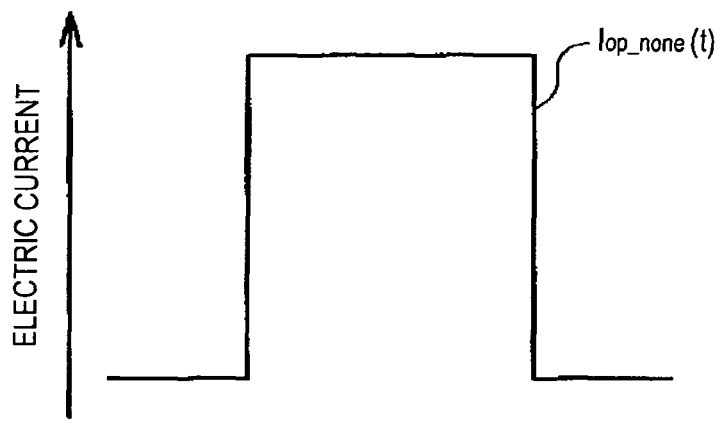
FIGS. 3A to 3C are graphs showing examples of current pulse waveforms generated in the laser drive circuit of FIG. 1.

The current source 21 pulse-drives the semiconductor laser, for example, outputting a rectangular current pulse ($I_{op-none}(t)$) as shown in FIG. 3A. The sign of a pulse-height value of the current pulse ($I_{op-none}(t)$) outputted from the current source 21 is positive.

Figure 3B:
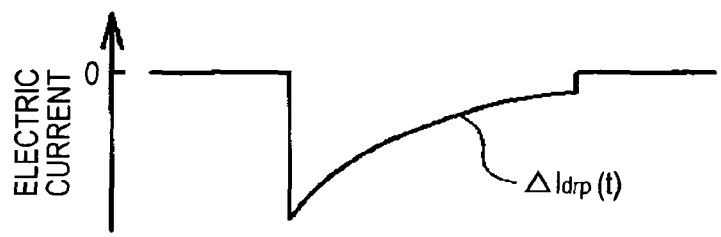
Figure 3C:
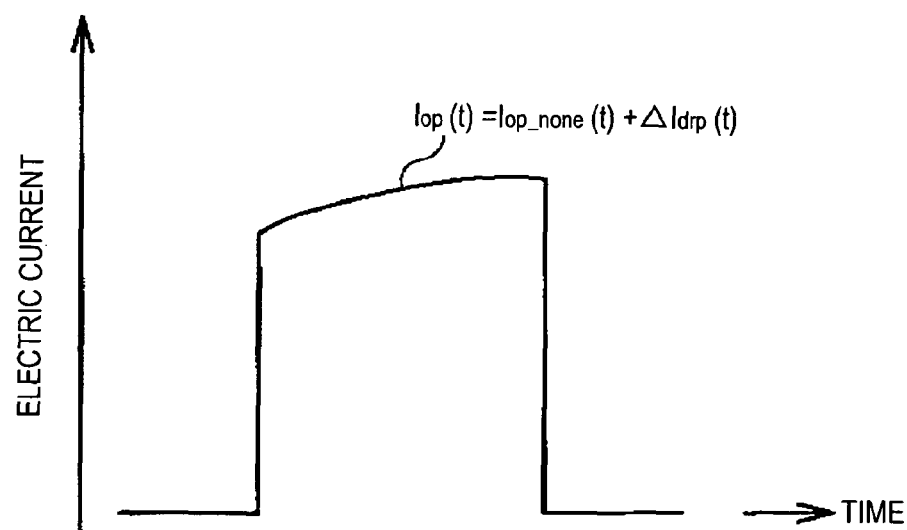

On the other hand, the correction circuit 22 corrects droop. The correction circuit 22 has an RC time constant circuit 22A, correcting a current pulse waveform outputted from the current source 21 so that a pulse waveform of light output of the semiconductor laser comes close to a rectangular shape by using the RC time constant circuit 22A. The correction circuit 22 corrects a waveform of the current pulse ($I_{op-none}(t)$) so that the pulse-height value is changed (saturated) with time in accordance with an RC time constant of the RC time constant circuit 22A as shown, for example, in FIG. 3C.

The correction circuit 22 outputs a current pulse ($\Delta I_{drp}(t)$) having a pulse-height value of a sign opposite (negative) to the sign of the pulse-height value of the current pulse ($I_{op-none}(t)$). The current pulse ($\Delta I_{drp}(t)$) has a pulse waveform to be changed (saturated) with time in accordance with the RC time constant of the RC time constant circuit 22A as shown, for example, in FIG. 3B. That is, an absolute value of the pulse-height value of the current pulse ($\Delta I_{drp}(t)$) is high at first, which is gradually reduced and finally becomes zero or a value close to zero.

The RC time constant circuit 22A has a first time constant circuit (not shown) which changes the pulse-height value of the ($I_{op\text{-}none}(t)$) with time. An RC time constant of the first time constant circuit is a value in a range from 1 µsec to 3 µsec. The correction circuit 22 corrects the pulse-height value of the current pulse ($\Delta I_{drp}(t)$) by using the first time constant circuit so that the pulse-height of the current pulse ($I_{op\text{-}none}(t)$) is changed (saturated) in accordance with the RC time constant of the first time constant circuit. The correction circuit 22 outputs the current pulse ($\Delta I_{drp}(t)$) in which the pulse-height value is changed (saturated) with time by using the above first time constant circuit as shown, for example, in FIG. 3B. Specifically, the correction circuit 22 outputs the current pulse ($\Delta I_{drp}(t)$) represented by the following Equation 1.

$$\Delta I_{drp}(t) = \Delta I_{max\_drp}(t) \cdot \exp(-t/T_{th1}) \quad \text{[Equation 1]}$$

Here, $\Delta I_{max\_drp}$ represents correction current at the time of inputting the pulse (t=0). $T_{th1}$ represents a time constant indicating temporal variation until the correction current reaches zero, which corresponds to the RC time constant of the first time constant circuit.

An absolute value of $\Delta I_{max\_drp}(t)$ corresponding to an initial value of the correction current becomes higher as drive current becomes higher as described later. Accordingly, $\Delta I_{max\_drp}(t)$ has a term which is in proportion to a drive current $I_{op}(t)$ (before correction). The absolute value of $\Delta I_{max\_drp}(t)$ becomes higher as ambient temperature of the semiconductor laser becomes higher as described later. Accordingly, $\Delta I_{max\_drp}(t)$ has a term which is in proportion to an ambient temperature $T_a$ of the semiconductor temperature. According to the above, $\Delta I_{max\_drp}(t)$ is represented by the following Equation 2.

$$\Delta I_{max\_drp}(t) = -A \cdot \{I_{op} - B \cdot (T_x - T_a)\} \quad \text{[Equation 2]}$$

Here, A and B are positive constants respectively indicating dependence between the drive current $I_{op}(t)$ and the ambient temperature $T_a$, and optimum values thereof are different according to devices. For example, in the case of a device in which linearity of I-L characteristics is excellent, a small value is sufficient for A. For example, when temperature dependence of the threshold is high in I-L characteristics, a value of B is preferably high. Tx is also a constant, and the optimum value thereof is different according to the wavelength detuning $\Delta\lambda$. In the case that the wavelength detuning $\Delta\lambda$ is high, the droop amount generated at the high-device temperature is small as compared with the case in which the wavelength detuning $\Delta\lambda$ is low, therefore, it is preferable that the value of Tx is high. Concerning behavior of the wavelength detuning $\Delta\lambda$ and light output due to temperature variation, it is seldom that variation according to devices occurs. Therefore, Tx and B are constants in which adjustment with respect to each device is not always necessary and it is preferable that a common fixed value is set in each device. On the other hand, the linearity of I-L characteristics differs according to manufacture as well as according to devices, therefore, it is preferable that the value of A is preferably adjusted according to each device.

The RC time constant circuit 22A further includes a second time constant circuit (not shown) which adjusts a peak of the pulse-height value of the current pulse outputted from the current source 21 when the current source 21 outputs the current pulse continuously. The second time constant circuit is used for considering a thermal factor remaining in the semiconductor laser (in the active layer) having the vertical cavity structure in which the active layer is sandwiched by a pair of multi-layer reflective mirrors (not shown) when the current source 21 outputs the current pulse to allow the semiconductor laser to emit light. The RC time constant in the second time circuit is a value corresponding to an approximately thermal time constant of the semiconductor laser, specifically, a value within a range from 1 µsec to 3 µsec. Accordingly, the correction circuit 22 can correct the pulse-height value of the current pulse outputted from the current source 21 so as to correspond to temperature variation of the semiconductor laser (active layer) by using the second time constant circuit.

Assume that the temperature variation of the semiconductor laser (active layer) is F(t) and the thermal time constant of the semiconductor laser (RC time constant of the second time constant circuit) is $T_{th2}$, F(t) is represented by the following Equation 3. And "t" in the equation represents time passed from each ON or each OFF.

$$F(t) = \begin{cases} 1 - \exp(-t/T_{th2}) & \text{at the time of ON} \\ \exp(-t/T_{th2}) & \text{at the time of OFF} \end{cases} \quad \text{[Equation 3]}$$

Figure 4A:
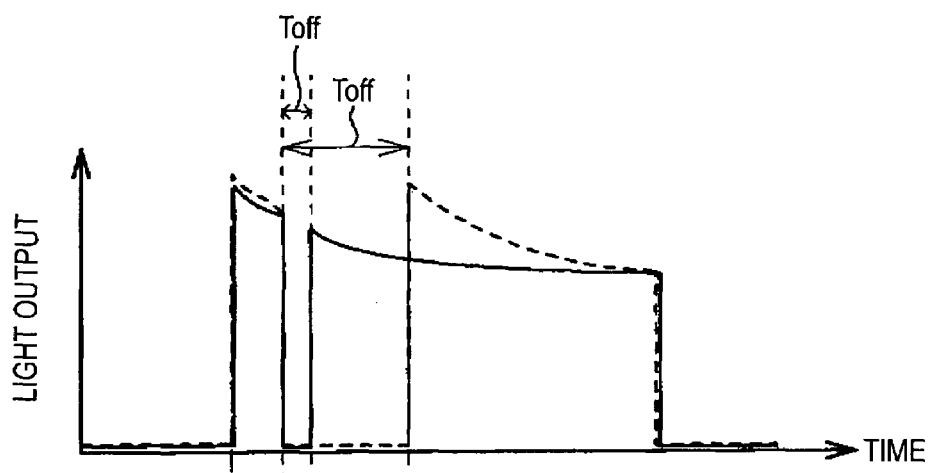
FIGS. 4A to 4C are graphs showing an example of a light output waveform of the semiconductor laser device of FIG. 1.
Figure 4B:
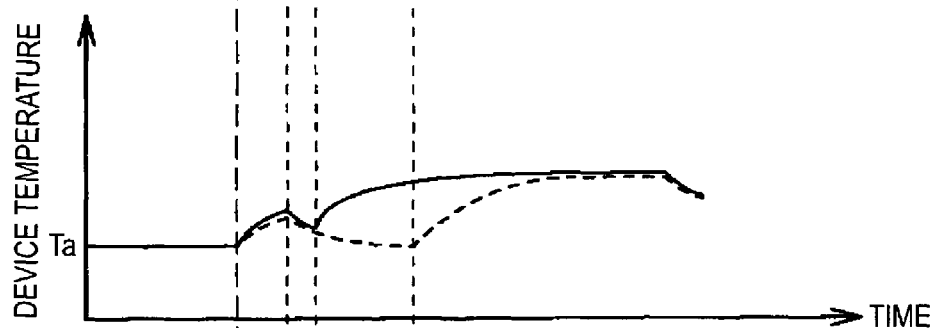
Figure 4C:
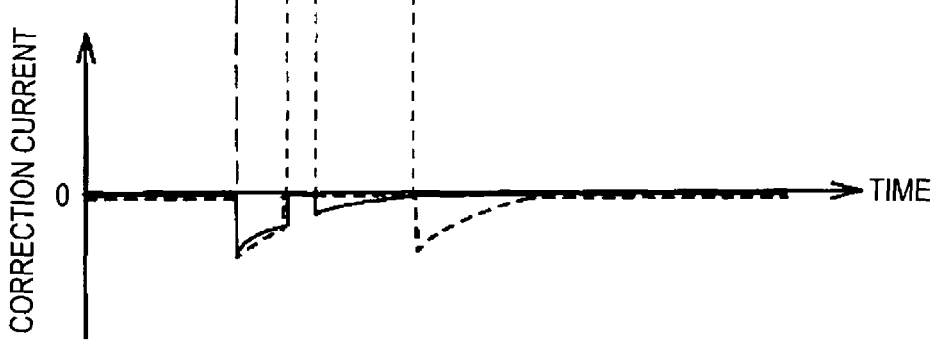

FIGS. 4A to 4C show an example of the relation among light output, device temperature and correction current. As shown in FIGS. 4A to 4C, when the first pulse is inputted, the device temperature of the semiconductor laser is increased due to self-heat generation. Next, the second pulse is inputted. Here, as an OFF period $T_{off}$ which is a period from the first pulse until the second pulse becomes longer, the heat generated by self-heat generation is released, as a result, the device temperature of the semiconductor laser comes close to the ambient temperature $T_a$. Therefore, the correction current to be applied is increased (in the negative direction) in accordance with the length of the OFF period $T_{off}$. According to the above, the correction current $\Delta I_{max\_drp}(t)$ with respect to an arbitrary pulse pattern is represented by the following equation.

$$\Delta I_{max\_drp}(t) = -A \cdot \{I_{op} - B \cdot (T_x - T_a)\} \cdot \{1 - F(t)\} \quad \text{[Equation 4]}$$

The right side of the above equation may have a positive value when the ambient temperature $T_a$ is low as well as the drive current $I_{op}$ is low. This indicates that the correction current $\Delta I_{max\_drp}(t)$ may be given in the positive direction under such conditions. However, self-heat generation to be generated is small under such conditions, therefore, droop is hardly generated. Therefore, the correction current $\Delta I_{max\_drp}(t)$ should not be given in the positive direction. When the right side of the above equation has the positive value, the correction current $\Delta I_{max\_drp}(t)$ is set to zero as shown in Equation 5.

$$\Delta I_{max\_drp}(t) = 0 \ldots -A \cdot \{I_{op} - B \cdot (T_x - T_a)\} \cdot \{1 - F(t)\} > 0 \quad \text{[Equation 5]}$$

In the laser drive circuit 20, for example, output terminals of the current source 21 and the correction circuit 22 are connected to each other as shown in FIG. 2. Therefore, the laser drive circuit 20 outputs a current pulse ($I_{op}(t) = I_{op\text{-}none}(t) + I_A(t)$) obtained by superimposing output of the current source 21 on output of the correction circuit 22. Accordingly, for example, in the case that the pulse waveform of light output of the semiconductor laser is rounded as compared with the waveform of the current pulse outputted from the current source 21 when only the output of the current source 21 is applied to the semiconductor laser, the current pulse obtained by superimposing output of the current source 21 on output of the correction circuit 22 is applied to the semiconductor laser, which enables the pulse waveform of light output of the semiconductor laser to be close to the rectangular shape as shown in FIG. 5A.

In the light emitting device 1 having the above configuration, the rectangular current pulse (electric current $I_{op\text{-}none}(t)$) is outputted from the current source 21 (FIG. 5A). At the same time, in the correction circuit 22, F(t) which indicates variation corresponding to variation of a thermal factor remaining in the semiconductor laser (active layer) (FIG. 5B), $\Delta I_{max\_drp}(t)$ which prescribes an initial value of the correction current (FIG. 5C) are derived by using the RC time constant circuit 22A. Subsequently, the value of $\Delta I_{max\_drp}(t)$ is maintained at the start point ($t_{2n}$) of the ON period when the semiconductor laser is ON/OFF driven in the correction circuit 22, and further, the current pulse ($\Delta I_{drp}(t)$) for attenuating the value in accordance with "exp$(-t/T_{th1})$" using the value as the starting point is derived (FIG. 5D), then, the current pulse ($\Delta I_{drp}(t)$) is outputted from the corrected circuit 22. After that, the current pulse ($I_{op}(t)=I_{op\text{-}none}(t)+\Delta I_{drp}(t)$) obtained by superimposing the output of the current source 21 on the output of the correction circuit 22 is applied to the semiconductor laser device 31 by the laser drive circuit 20 (FIG. 5E). Accordingly, rectangular light output is emitted outside from the semiconductor laser device 31.

Next, advantages of the light emitting device 1 according to the embodiment will be explained.

Normally, temperature increase in the active layer by current application is high and light output is reduced along with the temperature increase in the surface-emitting semiconductor laser because the resonator structure is minute. For example, in the surface-emitting semiconductor laser having an oscillation wavelength of 680 nm, when the ambient temperature is increased by 10° C. from the drive state of 50° C. and 1 mW, light output is reduced by approximately 20%. Even when the surface-emitting semiconductor laser is pulse-operated, the device temperature is gradually increased at the same time as the current pulse is applied to the device, and light output is gradually reduced along with the temperature increase.

As a method of correcting the phenomenon called droop, for example, the method described in Patent Document 2 exists. However, in the method described in Patent Document 2, there was a problem that it is difficult to correct the droop accurately when a droop curve varies in accordance with the difference of drive conditions such as light emitting patterns, current values, temperatures and so on.

On the other hand, according to the embodiment of the invention, the correction circuit 22 includes the first time constant circuit (circuit including the time constant $T_{th1}$) which gives temporal variation of the correction current and a second time constant circuit (circuit including the time constant $T_{th2}$) which gives the maximum current $\Delta I_{max\_drp}(t)$ at the start of each pulse corresponding to the initial value of the correction current. Here, the maximum current $\Delta I_{max\_drp}(t)$ varies in accordance with the ambient temperature Ta of the semiconductor laser, the drive current $I_{op}(t)$ and the temperature variation F(t) of the semiconductor laser (active layer). Further, the temperature variation F(t) of the semiconductor laser (active layer) varies in accordance with the time constant $T_{th2}$. Accordingly, it is possible to correct the droop accurately even when the droop curve varies in accordance with the difference of drive conditions such as light emitting patterns, current values and temperatures.

In the above embodiment, it is preferable that the correction circuit 22 corrects not only the droop but also the rising at the same time. Hereinafter, "rising correction" will be explained in detail below in a modified example.

The correction circuit 22 includes an RC time constant circuit 22B, correcting the current pulse waveform outputted from the current source 21 so that the pulse waveform of light output from the semiconductor laser comes close to the rectangular shape by using the RC time constant circuit 22B.

The RC time constant circuit 22B includes plural third time constant circuits (not shown) which attenuate the pulse-height value of the current pulse (electric current $I_{op\text{-}tune}(t)$) outputted from the current source 21 with time. RC time constants of respective third time constant circuits are different from one another. Specifically, the RC time constant of a fourth time constant circuit (not shown) which is at least one of the plural third time constant circuits is a value in a range from 20 nsec to 50 nsec. On the other hand, the RC time constant of one or plural fifth time constant circuits (not shown) which are time constant circuits other than the fourth time constant circuit in the plural third time constant circuits is a value exceeding 50 nsec (typically, 300 nsec to 1500 nsec). The correction circuit 22 makes a correction so that the pulse height of the current pulse outputted from the current source 21 is attenuated with time in accordance with the RC time constants of the RC time constant circuits by using the plural third time constant circuits. The correction circuit 22 outputs the current pulse (electric current $I_A(t)$) in which the pulse height has been attenuated with time as shown, for example, in FIG. 9B by using the third time constant circuits.

For example, assume that the RC time constant circuit 22B includes two third time constant circuits, one of the third constant circuits (fourth time constant circuit) has an RC time constant $T_{A1}$ in a range from 20 nsec to 50 nsec and the other third time constant circuit (fifth time constant circuit) has an RC time constant $T_{A2}$ of a value exceeding 50 nsec (typically a value in a range from 300 nsec to 1500 nsec). At this time, the correction circuit 22 outputs an assisting current $I_A(t)$ shown in the following Equation 6.

$$I_A(t) = \left(\frac{V_A}{K}\right) \cdot g(t) \quad \text{[Equation 6]}$$

Here, "k" represents a constant converting an assisting current factor $V_A$ into a current value. The assisting current factor $V_A$ is represented by the following Equation 7. And "g(t)" in Equation 7 is represented by the following Equation 8, where "g(t)" prescribes attenuance at the time of attenuating the pulse-height value of the current pulse (electric current $I_{op\text{-}none}(t)$) outputted from the current source 21 with time.

$$V_A = V_{offset} + V_{iop} - V_{ib} - V_o \quad \text{[Equation 7]}$$

$$g(t) = v \cdot \exp\left[-\frac{t}{T_{A1}}\right] + (1-v) \cdot \exp\left[-\frac{t}{T_{A2}}\right] \quad \text{[Equation 8]}$$

Here, "v" indicates a weight with respect to a term concerning the RC time constant $T_{A1}$, which is a value higher than 0.5 because the RC time constant $T_{A1}$ is dominant in the assisting current $I_A(t)$.

The assisting current factor $V_A$ in Equation 6 includes a factor $V_O$ determining a device temperature $T_O$ (ambient temperature), a factor $V_{ib}$ determining bias current and a factor $V_{iOP}$ determining operation current. That is, the correction circuit 22 changes the peak of the pulse-height value of the current pulse outputted from the current source 21 in accordance with the factor $V_O$ determining a device temperature $T_O$ (ambient temperature), the factor $V_{ib}$ determining the bias current and the factor $V_{iOP}$ determining the operation current.

Figure 10:
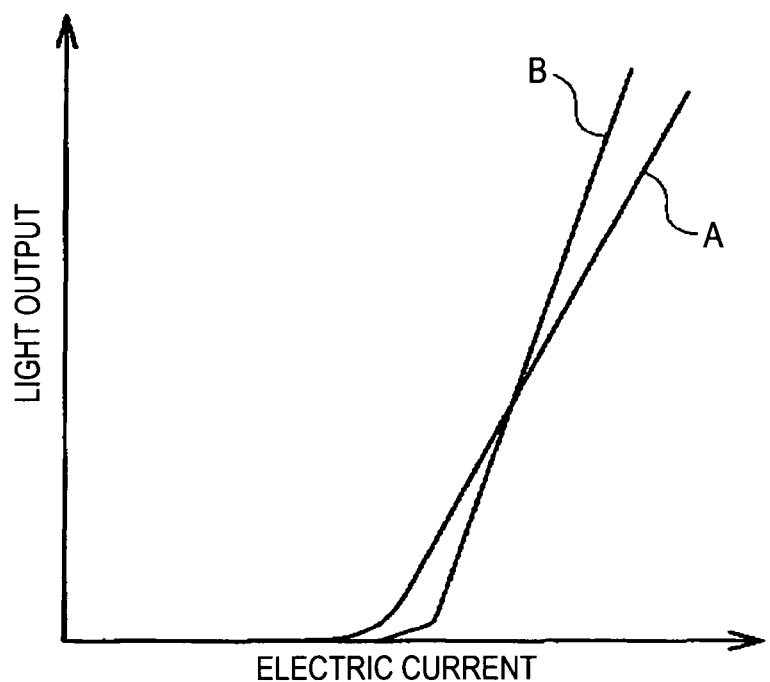
FIG. 10 is a graph showing an example of I-L characteristics of the semiconductor laser device of FIG. 1.

The assisting current factor $V_A$ in Equation 6 also includes an offset voltage $V_{offset}$. The offset voltage $V_{offset}$ compensates variation, for example, generated in the magnitude of the assisting current factor $V_A$ which is necessary when variation occurs in the I-L characteristics as shown by A and B in FIG. 10 due to the variation of the wavelength detuning $\Delta\lambda$ which is the difference between the emission wavelength of the active layer 53 and the oscillation wavelength of the surface-emitting semiconductor laser. Therefore, the correction circuit 22 adjusts the value of the offset voltage $V_{offset}$, thereby changing the peak of the pulse-height value of the current pulse outputted from the current source 21 in accordance with the magnitude of the wavelength detuning $\Delta\lambda$.

In Equation 6, "k" is also included. Therefore, the correction circuit 22 can change the peak of the pulse-height value of the current pulse outputted from the current source 21 also by adjusting the value of the constant "k" which converts the assisting current factor $V_A$ into the current value.

The RC time constant circuit 22B further includes plural sixth time constant circuits (not shown) adjusting the peak of the pulse-height value of the current pulse outputted from the current source 21 when the current source 21 outputs the current pulse continuously. The plural sixth time constant circuits are used for considering the thermal factor remaining in the semiconductor laser (in the later-described active layer 53) when the current source 21 outputs the current pulse to allow the semiconductor laser to emit light. Accordingly, the correction circuit 22 can make a correction so that the pulse-height value of the current pulse outputted from the current source 21 is changed in accordance with temperature variation of the active layer 53 by using the plural sixth time constant circuits.

The RC time constants of respective sixth time constant circuits are different to one another. Specifically, an RC time constant $T_{th3}$ of a seventh time constant circuit (not shown) which is at least one of the plural sixth time constant circuits is a value in a ranged from 20 nsec to 50 nsec. On the other hand, an RC time constant $T_{th4}$ of one or plural eighth time constant circuits (not shown) which are time constant circuits other than the seventh time constant circuit in the plural sixth time constant circuits is a value exceeding 50 nsec (typically, a value in a range from 30 nsec to 1500 nsec).

For example, assume that the RC time constant circuit 22B includes two sixth time constant circuits, one of the sixth constant circuits (seventh time constant circuit) has an RC time constant $T_{th3}$ in a range from 20 nsec to 50 nsec and the other sixth time constant circuit (eighth time constant circuit) has an RC time constant $T_{th4}$ of a value exceeding 50 nsec (typically a value in a range from 300 nsec to 1500 nsec). At this time, the correction circuit 22 outputs an assisting current $I_A(t)$ shown in the following Equation 9.

$$I_A(t) = I_{max}(t) \cdot g(t) \quad \text{[Equation 9]}$$

$I_{max}(t)$ in Equation 9 is represented by the following Equation 10. $I_{max}(t)$ prescribes the maximum value of the assisting current $I_A(t)$. And "f(t)" in Equation 10 is represented by the following Equation 11, where "f(t)" indicates variation corresponding to variation of the thermal factor remaining in the semiconductor laser (in the active layer 53). Therefore, the correction circuit 22 can make an accurate correction as if monitoring temperature variation of the active layer 53 in real time.

$$I_{max}(t) = \left(\frac{V_A}{\kappa}\right) \cdot (1 - f(t)) \quad \text{[Equation 10]}$$

$$\left.\begin{array}{l} \text{at the time of ON} \\ u \cdot \left[1 - \exp\left(-\frac{t}{T_{th1}}\right)\right] + (1-u) \cdot \left[1 - \exp\left(-\frac{t}{T_{th2}}\right)\right] \\ \text{at the time of OFF} \\ u \cdot \exp\left(-\frac{t}{T_{th1}}\right) + (1-u) \cdot \exp\left(-\frac{t}{T_{th2}}\right) \end{array}\right\} \equiv f(t) \quad \text{[Equation 11]}$$

Here, "u" indicates a weight with respect to a term concerning the RC time constant $T_{th3}$, which is a value higher than 0.5 because the RC time constant $T_{th3}$ is dominant in the assisting current $I_A(t)$. And "t" in the left side of the Equation 11 indicates the start point of the ON period or the start point of the OFF period when the semiconductor laser is ON/OFF driven.

In the laser drive circuit 20, for example, output terminals of the current source 21 and the correction circuit 22 are connected to each other as shown in FIG. 8. Therefore, the laser drive circuit 20 outputs the current pulse ($I_{op}(t) = I_{op-none}(t) + I_A(t)$) obtained by superimposing output of the current source 21 on output of the correction circuit 22. Accordingly, for example, in the case that the pulse waveform of light output of the semiconductor laser is rounded as compared with the waveform of the current pulse outputted from the current source 21 when only the output of the current source 21 is applied to the semiconductor laser, the current pulse obtained by superimposing output of the current source 21 on output of the correction circuit 22 is applied to the semiconductor laser, which enables the pulse waveform of light output of the semiconductor laser to be close to the rectangular shape.

Figure 11:
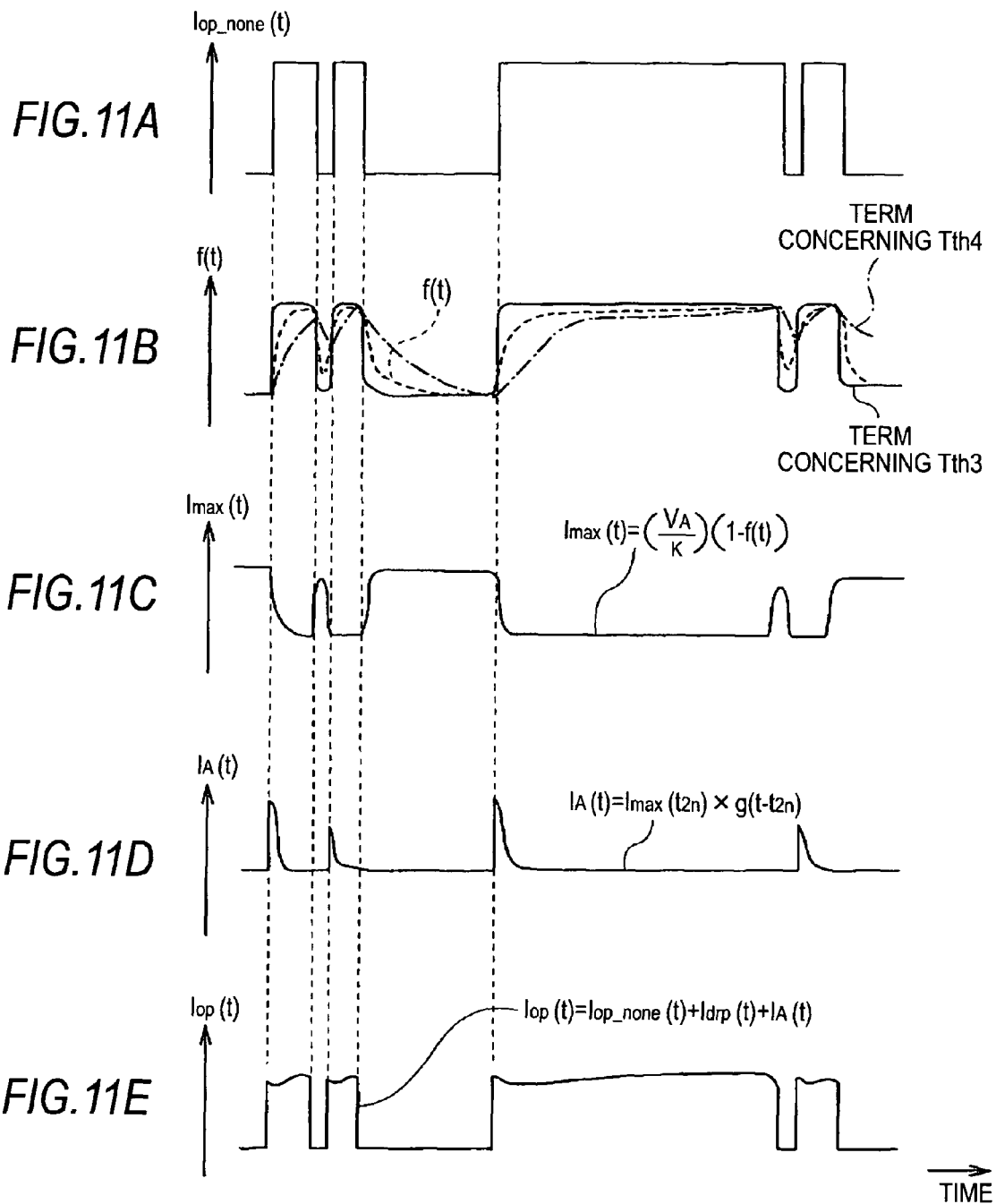
FIGS. 11A to 11E are waveform diagrams for explaining composition of an output waveform of the current source of FIG. 8 and an output waveform of the correction circuit of FIG. 8.

In the light emitting device 1 having the above configuration, the rectangular current pulse (electric current $I_{op-none}(t)$) is outputted from the current source 21 (FIG. 11A). At the same time, in the correction circuit 22, g(t) which prescribes attenuance at the time of attenuating the pulse-height value of the current pulse (electric current $I_{op-none}(t)$) outputted from the current source 21 with time, f(t) which indicates variation corresponding to variation of a thermal factor remaining in the semiconductor laser (active layer) (FIG. 11B), $\Delta I_{max}(t)$ which prescribes the maximum value of the assisting current $I_A(t)$ (FIG. 11C) are derived by using the RC time constant circuit 22A. Subsequently, the value of $\Delta I_{max}(t_{2n})$ is maintained at the start point ($t_{2n}$) of the ON period when the semiconductor laser is ON/OFF driven in the correction circuit 22, and further, the assisting current $I_A(t)$ for attenuating the value in accordance with g(t) using the value as the starting point is derived (FIG. 11D), then, the assisting current $I_A(t)$ is outputted from the corrected circuit 22. After that, the current pulse ($I_{op}(t) = I_{op-none}(t) + \Delta I_{drp}(t) + I_A(t)$) obtained by superimposing the output of the current source 21 on the output of the correction circuit 22 is applied to the semiconductor laser device 31 by the laser drive circuit 20 (FIG. 11E). Accordingly, rectangular light output is emitted outside from the semiconductor laser device 31.

Figure 12:
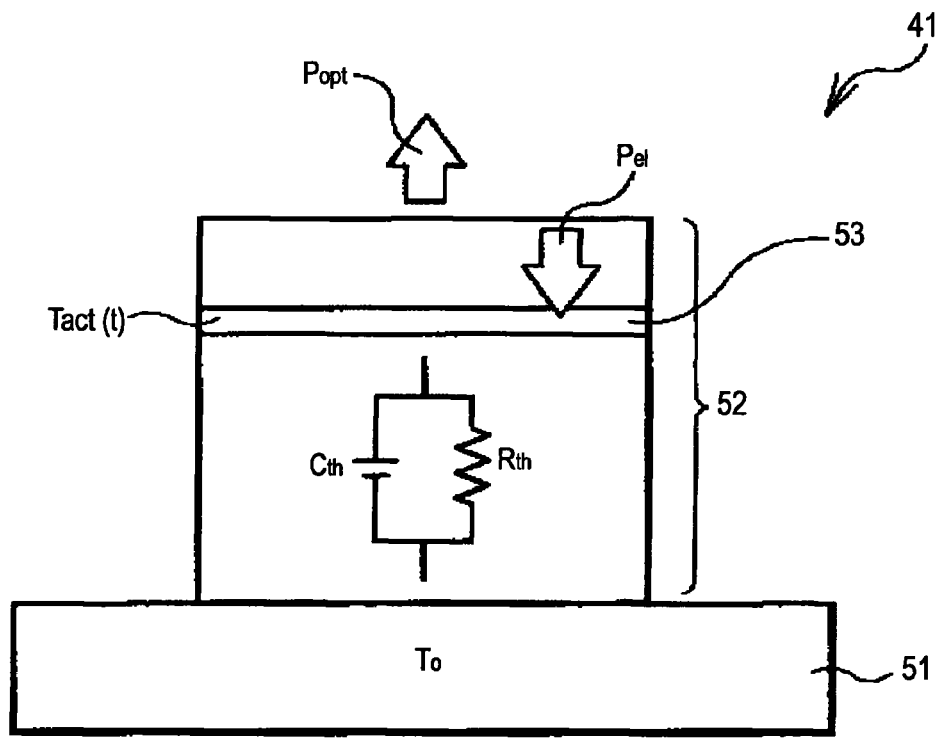
FIG. 12 is a view showing a schematic configuration of the semiconductor device of FIG. 1 and an example of a thermal circuit.

Next, reasons why the pulse waveform of light output from the semiconductor laser comes close to the rectangular shape will be explained. FIG. 12 shows a thermal circuit of a surface-emitting semiconductor laser included in the semiconductor laser device 31. When assuming that the temperature of the substrate 51 is $T_O$, a thermal capacity is $C_{th}$, a thermal resistance is $R_{th}$, the temperature of the active layer 53 (active layer temperature) at an arbitrary time point "t" is $T_{act}(t)$, the increased amount of the device temperature by the bias current (<threshold current) is $T_b(t)$, injected energy is $P_{el}$, and light output is $P_{out}$, thermal equations concerning the active layer temperature $T_{act}(t)$ are represented by the following Equations 12, 13. $R_{th}$ and $C_{th}$ indicate thermal time constants.

$$T_{act}(t) - T_o - (P_{el} - P_{opt})R_{th} = -R_{th}C_{th}\frac{d}{dt}(T_{act}(t)) \quad \text{[Equation 12]}$$

$$T_{act}(t) - T_o - T_b = -R_{th}C_{th}\frac{d}{dt}(T_{act}(t)) \quad \text{[Equation 13]}$$

When the above Equations 12, 13 are solved, the above Equations 12, 13 can be transformed into the following Equations 14, 15.

$$T_{act}(t) = T_o + (P_{el} - P_{opt})R_{th}\left\{1 - \exp\left[\frac{t - t_{2n} + \tau}{R_{th}C_{th}}\right]\right\} \quad \text{[Equation 14]}$$

$$T_{act}(t) = T_o + T_b + (T_{2n+1} - T_o - T_b)\exp\left[-\frac{t - t_{2n+1}}{R_{th}C_{th}}\right] \quad \text{[Equation 15]}$$

Figure 13:
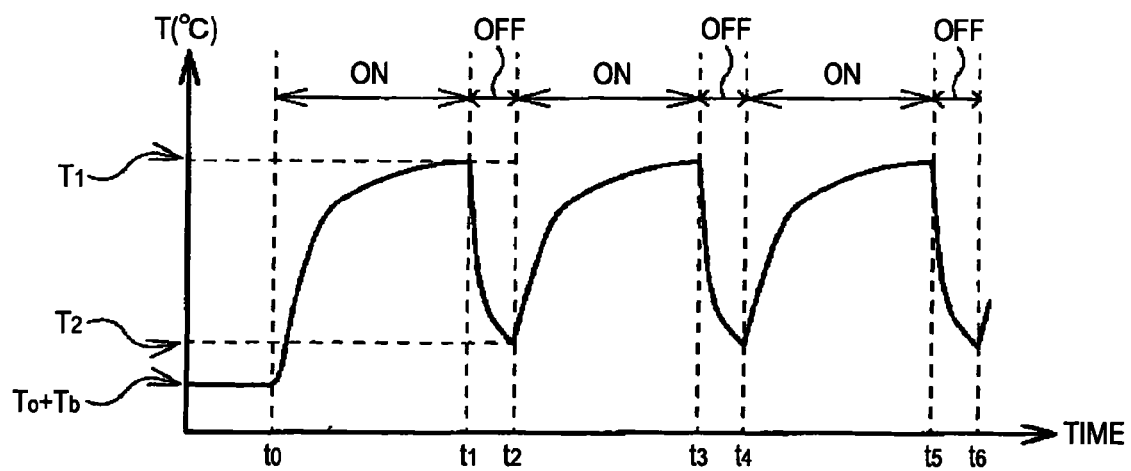
FIG. 13 is a waveform diagram for explaining a variable included in a thermal equation.
Figure 14A:
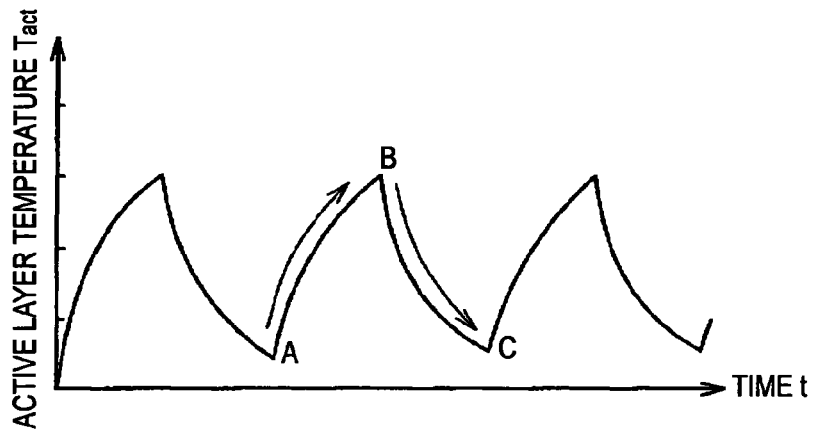
FIG. 14A is a graph showing temporal variation of active-layer temperature obtained by solving the thermal equation.

Here, "$t2_n$" ("n" is an integer of "0" or more) in Equation 14 indicates the start point of the ON period when the semiconductor laser is ON/OFF driven as shown in FIG. 13. On the other hand, "$t_{2n+1}$" in Equation 10 indicates the start point of the OFF period when the semiconductor laser is ON/OFF driven as shown in FIG. 13. And "τ" in Equation 14 indicates a coefficient for keeping $T_{act}(t)$ of Equation 14 and $T_{act}(t)$ in Equation 15 to be sequential. When Equations 14, 15 are expressed by a graph in the case that a value of the thermal time constants $R_{th}$, $C_{th}$ is 1 μsec, the graph will be as shown in FIG. 14A.

Generally, the cavity length is extremely small which is approximately 1λ to 2λ (λ is an oscillation wavelength) in the surface-emitting semiconductor laser, therefore, the oscillation wavelength is fixed by the cavity length. Accordingly, the surface-emitting semiconductor laser can oscillate at a wavelength different from the emission wavelength (wavelength of the maximum gain) of the active layer. Therefore, a device temperature at which a threshold current will be smallest can be arbitrarily selected depending on the design of the wavelength detuning Δλ. However, the device temperature at which the threshold current will be smallest will be a value in a range from 0° C. to 60° C.

Figure 14B:
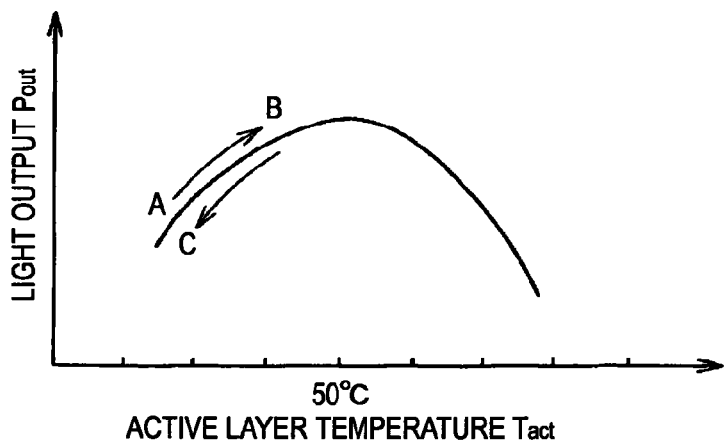
FIG. 14B is a graph showing the relation between the active layer temperature and light output obtained by actual measurement and FIG. 14C is a graph showing temporal variation of light output obtained from FIGS. 8A, 8b.
Figure 14C:
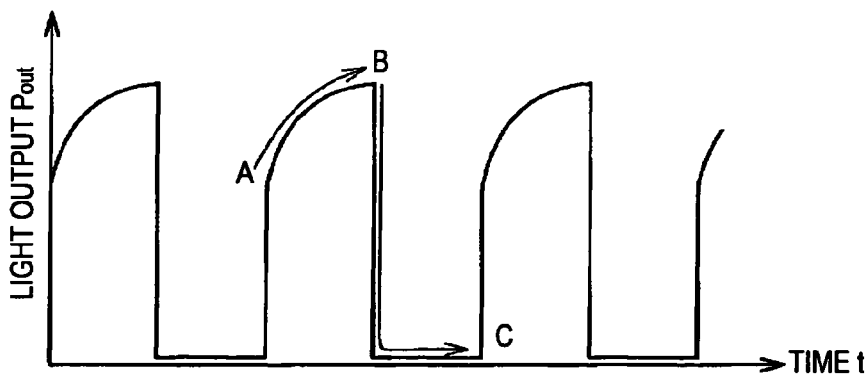

When sufficient light output is desired to be obtained on the high-temperature side, it is necessary to design the wavelength detuning Δλ to be high. For example, in a surface-emitting semiconductor laser in a band from 660 nm to 680 nm, in which an active layer 53 includes a red-color material (GaInP or AlGaInP), the threshold current becomes minimum when the wavelength detuning Δλ is 19 nm at a device temperature $T_0$ of approximately 50° C. Incidentally, the fact that the threshold current has temperature dependence means that light output under fixed current also has temperature dependence. For example, as shown in FIG. 14B, in the case of the self-emitting semiconductor laser designed so that the wavelength detuning Δλ becomes 19 nm, light output becomes maximum when the device temperature $T_O$ is at approximately 50° C., and light output is reduced when the device temperature $T_O$ is lower than or higher than 50° C. Accordingly, temporal variation in light output can be depicted. As shown in FIGS. 14A to 14C, the active layer temperature $T_{act}(t)$ is increased as well as the light output $P_{out}$ is also increased at the time of moving from A to B, and the active layer temperature $T_{act}(t)$ is reduced and the light output $P_{out}$ becomes zero at the time of moving from B to C during a period when electric current is OFF.

Figure 15:
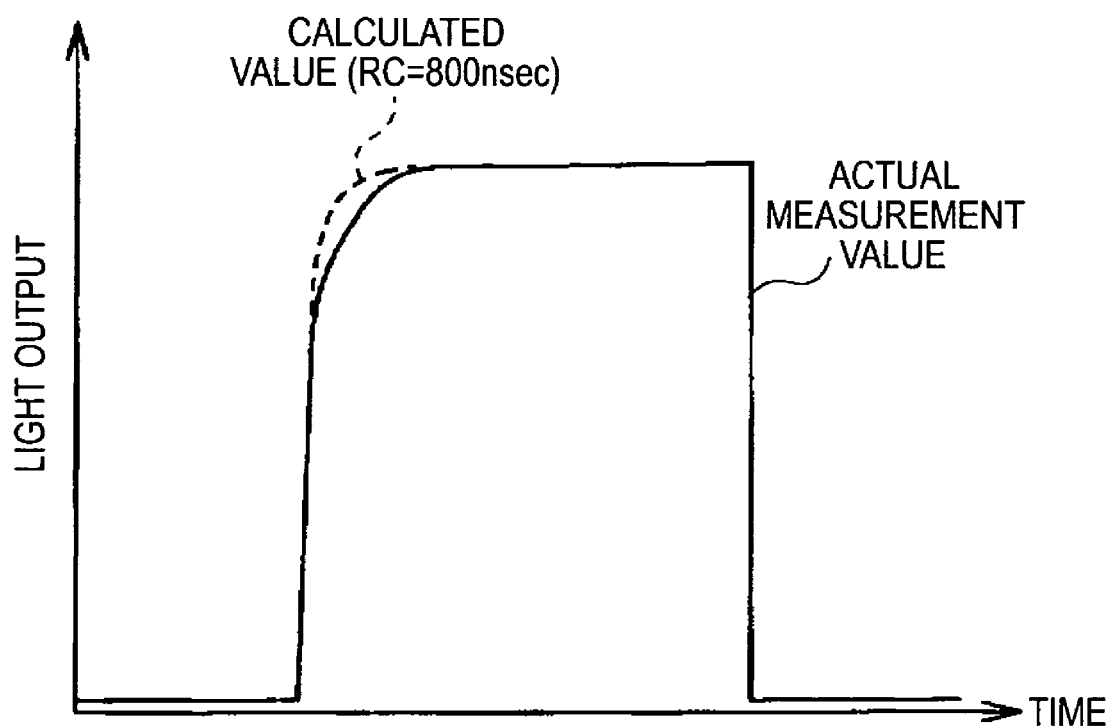
FIG. 15 is a graph showing an actual-measurement value and a calculated value in temporal variation of light output.

Accordingly, temporal variation in the light output $P_{out}$ can be led from the thermal equations and the dependence of the active layer temperature of the light output $P_{out}$. Accordingly, for example, the result (calculated value) is compared with a light waveform (actual measurement value) obtained by actual measurement as shown in FIG. 15. Then, it was found that these values correspond to each other at a point after several 100 nsec has passed from the pulse rising, when the thermal time constants $R_{th}$, $C_{th}$ are 800 nsec. However, they do not correspond to each other at the time of pulse rising. It is found that the thermal time constants $R_{th}$, $C_{th}$ vary in values a digit or more smaller than 800 nsec (approximately 200 nsec to 500 nsec) at the time of pulse rising.

The reason why there are two time constants in the light waveform is considered that the heat generation states in the surface-emitting semiconductor laser are different at the timing after the pulse rising and at the time of the pulse rising. After the pulse rising, it can be considered that the entire Mesa in the surface-emitting semiconductor laser generates heat, which increases the thermal constant. On the other hand, the active layer partially generates heat at the time of the pulse rising, which reduces the time constant. The thermal equations are formed on the assumption that the entire Mesa generates heat, therefore, the light waveform at the time of the pulse rising is not accurately expressed.

In the modified example, plural time constant circuits (the fourth time constant circuit and the fifth time constant circuit) having different time constants are provided at the RC time constant circuit 22B in the correction circuit 22 as described above. Accordingly, the waveform of the current pulse outputted from the current source 21 which pulse-drives the surface-emitting semiconductor laser can be corrected so that the pulse waveform of light output from the semiconductor laser comes close to the rectangular shape by using the correction circuit 22 including the RC time constant circuit 22B. According to the modified example, not only a gradual slope portion after the rising edge of the waveform of the current pulse outputted from the current source 21 but also a sharply curved portion at the time of the rising can be close to the rectangular shape by using the RC time constant circuit 22B. As a result, waveform rounding of light output due to the wavelength detuning Δλ can be reduced.

In the modified example, the peak of the pulse-height value of the current pulse outputted from the current source 21 varies in the correction circuit 22 in accordance with the factor $V_O$ which determines the device temperature $T_O$. Accordingly, even when the environmental temperature (for example, temperature in a printer casing) varies and the wavelength detuning Δλ, varies with the temperature variation, the waveform rounding of light output can be reduced.

In the embodiment, the pulse-height value of the current pulse outputted from the current supply 21 varies in accordance with temperature variation of the active layer 53 in the correction circuit 22. Accordingly, the current pulse from the current source 21 is outputted continuously, and the correction amount of the pulse-height value of the current pulse can be set to an appropriate value even when the thermal factor remains in the semiconductor laser (active layer 53). As a result, even when the current source 21 outputs the current pulse continuously, the waveform rounding of light output can be reduced.

Also in the modified example, the peak of the pulse-height value of the current pulse outputted from the current pulse 21 can be changed in accordance with the magnitude of the wavelength detuning Δλ by adjusting the value of the offset voltage $V_{offset}$, or by adjusting the value of the constant "k" which converting the assisting current factor $V_A$ into the current value. Which value should be adjusted is preferably determined based on tendency of variation in light output with respect to temperature variation. For example, when assuming that a current confinement diameter of the surface-emitting semiconductor laser is larger than a desired value due to manufacture variation, the variation amount of light output with respect to temperature variation is increased in this case (that is, temperature dependence of light output is increased), therefore, the value of the constant "k" is preferably adjusted. Additionally, for example, when assuming that the wavelength detuning $\Delta\lambda$ of the surface-emitting semiconductor laser is increased due to manufacture variation, the temperature at which light output becomes maximum is shifted to the high-temperature side (that is, temperature dependence of light output is shifted to the high-temperature side), therefore, the value of the offset voltage $V_{offset}$ is preferably adjusted. As described above, in the embodiment, the preferable correction method can be selected based on the tendency of variation in light output with respect to temperature variation, therefore, the waveform rounding of light output can be positively reduced.

The rounding at the rising edge appears noticeably in lower power and lower temperature. On the other hand, the droop does not occur in low power and low temperature. Therefore, the droop correction is not necessary as long as driven in low temperature and low power. Conversely, the rising is improved in high temperature and high power, whereas the droop occurs, therefore, the droop correction is more necessary in high temperature and high power. According to the above, both functions of the rising correction and the droop correction are provided in the modified example, which can expand the drive range of the laser (temperature, light output). In a red-color surface-emitting semiconductor laser, the temperature range of 0° C. to 60° C. and approximately five-times of light output dynamic range are necessary, and two types of correction functions as in the modified example are indispensable for practical implementation.

The present application contains subject matter related to that disclosed in Japanese Priority Patent Application JP 2010-083267 filed in the Japan Patent Office on Mar. 31, 2010, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed:

1. A drive circuit configured to drive a light-emitting device, the drive circuit comprising:
   a current source configured to output a drive current; and
   a correction circuit configured to output a correction current, the correction circuit including
   a first RC time constant circuit configured to correct for a decrease in light output from the light-emitting device over time,
   wherein an output terminal of the current source is connected to an output terminal of the correction circuit.

2. A drive circuit according to claim 1, wherein the light emitting device is a surface-emitting semiconductor laser.

3. A drive circuit according to claim 1, wherein the first RC time constant circuit includes a first time constant circuit configured to cause a temporal variation of the correction current.

4. A drive circuit according to claim 3, wherein a first time constant of the first time constant circuit is in a range of 1 microsecond to 3 microseconds.

5. A drive circuit according to claim 3, wherein the first RC time constant circuit further includes a second time constant circuit configured to correct for a thermal factor of the light-emitting device.

6. A drive circuit according to claim 5, wherein a time constant of the second time constant circuit is in a range of 1 microsecond to 3 microseconds.

7. A drive circuit according to claim 5, wherein the second time constant circuit is configured to correct for the thermal factor of the light-emitting device by adjusting a pulse-height value of the drive current.

8. A drive circuit according to claim 1, wherein the correction circuit further includes a second RC time constant circuit, and
   the second RC time constant circuit is configured to correct for a gradual rise in light output from the light-emitting device.

9. A drive circuit according to claim 8, wherein the light emitting device is a surface-emitting semiconductor laser.

10. A drive circuit according to claim 8, wherein the second RC time constant circuit includes a plurality of third time constant circuits configured to attenuate a pulse-height of the drive current with time.

11. A drive circuit according to claim 10, wherein the third time constant circuits include a fourth time constant circuit having a time constant in a range of 20 nanoseconds to 50 nanoseconds, and a fifth time constant circuit having a time constant greater than 50 nanoseconds.

12. A drive circuit according to claim 10, wherein the first RC time constant circuit further includes a plurality of sixth time constant circuits configured to correct for a thermal factor of the light-emitting device.

13. A drive circuit according to claim 12, wherein the sixth time constant circuits include a seventh time constant circuit having a time constant in a range of 20 nanoseconds to 50 nanoseconds, and an eighth time constant circuit having a time constant greater than 50 nanoseconds.

14. A drive current correcting method comprising:
   outputting a drive current configured to drive to a light-emitting device;
   outputting a correction current, the correction current being output by a correction circuit that includes a first RC time constant circuit configured to correct for a decrease in light output from the light-emitting device over time; and
   superimposing the drive current onto the correction current.

15. A drive current correcting method according to claim 14, wherein the light emitting device is a surface-emitting semiconductor laser.

16. A drive current correcting method according to claim 14, wherein the first RC time constant circuit includes a first time constant circuit configured to cause a temporal variation of the correction current.

17. A drive current correcting method according to claim 16, wherein a first time constant of the first time constant circuit is in a range of 1 microsecond to 3 microseconds.

18. A drive current correcting method according to claim 16, wherein the first RC time constant circuit further includes a second time constant circuit configured to correct for a thermal factor of the light-emitting device.

19. A drive current correcting method according to claim 18, wherein a time constant of the second time constant circuit is in a range of 1 microsecond to 3 microseconds.

20. A drive current correcting method according to claim 18, wherein the second time constant circuit is configured to correct for the thermal factor of the light-emitting device by adjusting a pulse-height value of the drive current.

21. A drive current correcting method according to claim 14, wherein the correction circuit further includes a second RC time constant circuit, and
the second RC time constant circuit is configured to correct for a gradual rise in light output from the light-emitting device.

22. A drive current correcting method according to claim 21, wherein the light emitting device is a surface-emitting semiconductor laser.

23. A drive current correcting method according to claim 21, wherein the second RC time constant circuit includes a plurality of third time constant circuits configured to attenuate a pulse-height of the drive current with time.

24. A drive current correcting method according to claim 23, wherein the third time constant circuits include a fourth time constant circuit having a time constant in a range of 20 nanoseconds to 50 nanoseconds, and a fifth time constant circuit having a time constant greater than 50 nanoseconds.

25. A drive current correcting method according to claim 23, wherein the first RC time constant circuit further includes a plurality of sixth time constant circuits configured to correct for a thermal factor of the light-emitting device.

26. A drive current correcting method according to claim 25, wherein the sixth time constant circuits include a seventh time constant circuit having a time constant in a range of 20 nanoseconds to 50 nanoseconds, and an eighth time constant circuit having a time constant greater than 50 nanoseconds.

27. A drive circuit comprising:
means for outputting a drive current configured to drive to a light-emitting device;
means for outputting a correction current, the correction current being output by a correction circuit that includes a first RC time constant circuit configured to correct for a decrease in light output from the light-emitting device over time; and
means for superimposing the drive current onto the correction current.

* * * * *